(12) United States Patent
Tanaka

(10) Patent No.: US 6,417,529 B1
(45) Date of Patent: Jul. 9, 2002

(54) FUNCTION CELL, SEMICONDUCTOR DEVICE INCLUDING FUNCTION CELL, AND SEMICONDUCTOR CIRCUIT DESIGNING METHOD USING FUNCTION CELL

(75) Inventor: Genichi Tanaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/301,357

(22) Filed: Apr. 29, 1999

(30) Foreign Application Priority Data

Nov. 12, 1998 (JP) .......................... 10-321908

(51) Int. Cl.[7] .................. H01L 27/10; H01L 21/82; H01L 21/4763; H01L 21/44
(52) U.S. Cl. .................. 257/202; 257/203; 257/204; 257/206; 257/208; 257/211; 438/128; 438/587; 438/598; 438/129
(58) Field of Search .................. 257/202, 203, 257/204, 206, 208, 211; 438/128, 587, 598, 129

(56) References Cited

U.S. PATENT DOCUMENTS

| | | | |
|---|---|---|---|
| 4,916,514 A | * | 4/1990 | Nowak .................. 357/68 |
| 5,032,890 A | * | 7/1991 | Ushiku et al. .................. 357/41 |
| 5,612,553 A | | 3/1997 | Arakawa |
| 5,698,873 A | | 12/1997 | Colwell et al. |
| 5,796,129 A | * | 8/1998 | Mizuno .................. 257/206 |
| 5,959,905 A | * | 9/1999 | Payne .................. 365/200 |

FOREIGN PATENT DOCUMENTS

| JP | 04142761 A | * | 5/1992 |
|---|---|---|---|
| JP | 5-48050 | | 2/1993 |

* cited by examiner

Primary Examiner—Stephen D. Meier
Assistant Examiner—James Mitchell
(74) Attorney, Agent, or Firm—McDermott, Will & Emery

(57) ABSTRACT

A function cell capable of shortening the term necessary for circuit designing, a semiconductor device including the function cell, and a semiconductor circuit designing method using the function cell are obtained. The semiconductor device includes first and second function cells that realize the same logic circuit function and have different electrical characteristics from each other. The first function cell includes a first externally connected interconnection. The second function cell includes a second externally connected interconnection. The external shape of the first function cell is almost the same as the external shape of the second function cell. The position of the first externally connected interconnection on the first function cell plane is almost the same as the position of the plane.

14 Claims, 11 Drawing Sheets

FUNCTION CELL, SEMICONDUCTOR DEVICE INCLUDING FUNCTION CELL, AND SEMICONDUCTOR CIRCUIT DESIGNING METHOD USING FUNCTION CELL

BACKGROUND OF THE INVENTION

1. Field of the Invention

The present invention relates to a function cell, a semiconductor device including the function cell, and a semiconductor circuit designing method using the function cell. More particularly, the present invention relates to a function cell used in cell-base semiconductor circuit designing, a semiconductor device including the function cell, and a semiconductor circuit designing method using the function cell.

2. Description of the Background Art

The semiconductor circuit designing method of the cell-base type, represented by the standard cell type, is conventionally known as one of the semiconductor circuit designing methods. In the cell-base type semiconductor circuit designing method, circuit designing of semiconductor devices has been carried out by combining function cells, according to users' demand, from a cell library that includes multiple kinds of function cells for realizing desired logic circuit functions.

FIGS. 11 and 12 are schematic plan views of function cells used in the conventional cell-base type semiconductor circuit designing method. FIG. 13 is an equivalent circuit diagram showing the logic circuit function realized by the function cells shown in FIGS. 11 and 12. Referring to FIGS. 11 to 13, the function cells will be described.

Referring first to FIG. 13, an inverter is realized in the function cells shown in FIGS. 11 and 12. The inverter circuit includes two transistors 120, 121. Transistors 120, 121 have their gate electrodes connected to an input terminal 112. Here, p type field effect transistor 120 has its source region connected to an interconnection for a power supply (hereinafter, referred to as a power-supply interconnection) 110 and its drain region connected to the drain region of n type field effect transistor 121 and to an output pin terminal 106a. Further, n type field effect transistor 121 has its source region connected to an interconnection for a ground (hereinafter, referred to as a ground interconnection) 111. The function cells shown in FIGS. 11 and 12 are formed to realize such a logic circuit.

Referring to FIG. 11, the function cell includes p type impurity diffusion regions 107a, 107b, n type impurity diffusion regions 107c, 107d, gate electrodes 108a, 108b, input pin terminal 112, output pin terminal 106a, power-supply interconnection 110, and ground interconnection 111. Impurity diffusion regions 107a to 107d are formed at a main surface of a semiconductor substrate. Between p type impurity diffusion regions 107a and 107b, gate electrode 108a is formed on the main surface of the semiconductor substrate with a gate insulation film (not shown) therebetween. Here, p type impurity diffusion regions 107a, 107b serving as source/drain regions, the gate insulation film, and gate electrode 108a constitute p type field effect transistor 120.

In another region of the function cell, n type impurity diffusion regions 107c, 107d, the gate insulation film, and gate electrode 108b also constitute n type field effect transistor 121. It is noted that n type field effect transistor 121 basically has a similar configuration to that of p type field effect transistor 120.

On impurity diffusion regions 107b, 107d, output pin terminal 106a is formed with an interlayer insulation film (not shown) therebetween. Output pin terminal 106a and impurity diffusion region 107b are electrically connected via contact holes 109g, 109h. Output pin terminal 106a and n type impurity diffusion region 107d are electrically connected via contact holes 109i, 109j.

On p type impurity diffusion region 107a, power-supply interconnection 110 is formed with an interlayer insulation film (not shown) therebetween. Power-supply interconnection 110 and p type impurity diffusion region 107a are electrically connected via contact holes 109c, 109d. On n type impurity diffusion region 107c, ground interconnection 111 is formed with an interlayer insulation film (not shown) therebetween. Ground interconnection 111 and n type impurity diffusion region 107c are electrically connected via contact holes 109e, 109f. On gate electrodes 108a, 108b, input pin terminal 112 is formed with an interlayer insulation film (not shown) therebetween. Gate electrode 108a and input pin terminal 112 are electrically connected via contact hole 109a. Gate electrode 108b and input pin terminal 112 are electrically connected via contact hole 109b.

A longitudinal pin access route to input pin terminal 112 (route of an external interconnection to input pin terminal 112) is denoted by 113a. Lateral pin access routes to input pin terminal 112 are denoted by 114a, 114b. A longitudinal pin access route to output pin terminal 106a is denoted by 113b. Lateral pin access routes to output pin terminal 106a are denoted by 115a to 115f. It is noted that the pin access route is a position in which a normally used route of an externally connected interconnection to input pin terminal 112, output pin terminal 106a or the like of the function cell can be set during circuit designing.

The longitudinal length (height) and lateral length (width) of the function cell are set at H7 and W7 so that they become as small as possible in accordance with the sizes of field effect transistors 120, 121 and the like.

FIG. 12 is a schematic plan view showing another function cell for realizing the logic circuit shown in FIG. 13, similarly to the function cell shown in FIG. 11. Referring to FIG. 12, the function cell basically has a similar configuration to that of the function cell shown in FIG. 11. In the function cell shown in FIG. 12, however, the size of impurity diffusion regions 107e to 107h is larger than that of impurity diffusion regions 107a to 107d. This is because, by changing the size of impurity diffusion regions 107e to 107h, the drivability of p type field effect transistor 120 and n type field effect transistor 121 is changed to realize electrical characteristics different from those of the function cell shown in FIG. 11.

Since the configuration of p type field effect transistor 120 and n type field effect transistor 121 is changed to change the electrical characteristics as described above, the external shape (longitudinal length H8 and lateral length W8, the external shape herein is determined by the longitudinal length and lateral length of a function cell) of the function cell shown in FIG. 12 becomes larger than the external shape (longitudinal length H7 and lateral length W7) of the function cell shown in FIG. 11.

Since the external shape of the function cell is changed in this manner, the size and position of input pin terminal 112 and output pin terminal 106b in the function cell shown in FIG. 12 are also changed as compared with the function cell shown in FIG. 11. Accordingly, the position of longitudinal pin access route 113c in the function cell shown in FIG. 12 is different from the position of longitudinal pin access route 113a in the function cell shown in FIG. 11. Similarly, the position of lateral pin access routes 114c, 114d in the function cell shown in FIG. 12 is also different from the position of lateral pin access routes 114a, 114b in the function cell shown in FIG. 11.

Further, the position of longitudinal pin access route 113d and lateral pin access routes 115g to 115n to output pin terminal 106b in the function cell shown in FIG. 12 is also different from the position of longitudinal pin access route 113b and lateral pin access routes 115a to 115f in the function cell shown in FIG. 11.

FIG. 14 is a flow chart of a conventional cell-base type semiconductor device circuit designing process using the function cells shown in FIGS. 11 and 12. Referring to FIG. 14, the flow of the conventional semiconductor circuit designing process will be described.

First, a step of selecting and placing function cells having a necessary function from a cell library (S1) is carried out. Then, a step of routing interconnections for connecting the placed function cells and connecting the function cells and an input/output circuit (S2) is carried out. Then, the verification test of circuit electrical characteristics (S3) is carried out as to whether a prescribed condition such as the condition of signal timing constraints is satisfied when the circuit formed of the function cells and the interconnections is supplied with a signal. When the prescribed condition is satisfied in the verification test (S3), circuit designing is ended (S6).

When the prescribed condition is not satisfied in the verification test (S3), however, a logic correction step (S4) is carried out. In the logic correction step (S4), the circuit is adjusted to satisfy the prescribed condition if a function cell that causes the dissatisfied condition is replaced by a function cell that has such electric characteristics, for example, of drivability and power consumption that satisfy the condition above even if the newly used function cell realizes the same logic circuit as the function cell to be replaced. Thereafter, as a result of the logic correction step (S4), a function cell replacement step (S5) of replacing the function cell to be changed with a function cell to be newly used is carried out.

Even if both of the function cells realize the same logic circuit, their gate widths are different if their electrical characteristics are different. Thus, the external shapes of the function cells are different as shown in FIGS. 11 and 12. As a result, when the function cells are simply replaced, the replaced function cell may overlap a neighboring function cell, or an unnecessary space may be created. Accordingly, a step of correcting the function cell placement (S7) has to be carried out. Since the function cell placement is corrected, there is a need to correct the routes for connecting the function cells and connecting the function cells and the input/output circuit. Thus, a step of correcting the routes of interconnections (S8) is carried out.

When the processing from the function cell replacement step (S5) to the routing (interconnection route) correction step (S8) is to be carried out, how the signal timing in the circuit, for example, is changed by the final cell placement and interconnection routes is estimated, and based on the estimate, the function cell replacement and the interconnection route correction are carried out to satisfy the condition of constraints. Since the estimate is not perfect, however, the verification test (S3) has to be carried out again after the interconnection route correction step (S8), as to whether the condition of constraints such as the condition of signal timing is satisfied.

According to the result of the verification test (S3), there is a case in which the logic correction step (S4), the function cell replacement step (S5), the function cell placement correction step (S7), the interconnection route correction step (S8) are repeated again, and the verification test (S3) for determining whether the condition of constraints is satisfied is also repeated. Accordingly, the time necessary to design semiconductor circuits is increased, which in turn increases the term for designing semiconductor devices. The increased term for designing has been a cause of the increased manufacturing cost of semiconductor devices.

SUMMARY OF THE INVENTION

One object of the present invention is to provide a function cell capable of shortening the term for designing semiconductor device circuits using the cell-base type semiconductor circuit designing method.

Another object of the present invention is to provide a semiconductor device capable of shortening the term for designing semiconductor device circuits even when the cell-base type semiconductor circuit designing method is used.

Still another object of the present invention is to provide a cell-base type semiconductor circuit designing method capable of shortening the term for designing semiconductor device circuits as compared with conventional methods.

A semiconductor device in one aspect of the present invention includes first and second function cells. The first and second function cells realize the same logic circuit function and have different electrical characteristics from each other. The first function cell includes a first externally connected interconnection. The second function cell includes a second externally connected interconnection. The external shape of the first function cell is almost the same as the external shape of the second function cell. The position of the first externally connected interconnection in the first function cell is almost the same as the position of the second externally connected interconnection in the second function cell.

It is assumed here that logic correction is carried so that the second function cell is used in stead of the first function cell to adjust signal timing, for example, when a semiconductor device circuit is designed in the semiconductor device manufacturing process. Since the external shapes of the first and second function cells are almost the same and the positions of the first and second externally connected interconnections in the first and second function cells are almost the same even in this case, the route of the externally connected interconnection (routing) that is determined on the premise that the first function cell is used can be applied as it is to the second function cell.

Since pin access routes in the first and second function cells can accordingly be made almost the same, the pin access routes do not have to be set again even when replacement of the first and second function cells is carried out. Since the external shapes of the first and second function cells are almost the same, the placement of the function cell does not have to be corrected. As a result, logic correction can be carried out easily by replacing the first and second function cells.

Even after logic correction is carried out, the placement of the function cell and the route of the externally connected interconnection are not changed. Accordingly, the condition of circuit constraints can reliably be satisfied by adjusting the electrical characteristics of the function cell. Thus, a verification test for determining whether the condition of constraints such as of signal timing does not have to be carried out again. As a result, the time necessary for the semiconductor device circuit designing process can substantially be reduced as compared with conventional processes.

Since a plurality of function cells that realize the same logic circuit function as the first function cell and have different electrical characteristics are prepared in a cell library used in semiconductor circuit designing, such a function cell having better electrical characteristics that realizes much higher speed and much lower power consumption of the semiconductor circuit can be selected from function cells that satisfy the condition of constraints such as of signal timing of the circuit. As a result, a semiconductor device capable of operating at high speed and a semiconductor device allowing low power consumption can be obtained more easily.

In the semiconductor device in the one aspect above, the first function cell may include a dummy interconnection formed almost on the same plane as the first externally connected interconnection. The position of a region occupied by the first externally connected interconnection and the dummy interconnection on the first function cell plane may be almost the same as the position of a region occupied by the second externally connected interconnection on the second function cell plane.

In this case, even when the outline of the first externally connected interconnection in the first function cell is different from the outline of the second externally connected interconnection in the second function cell, the position of the region occupied by the first externally connected interconnection and the dummy interconnection can be made almost the same as the position of the region occupied by the second externally connected interconnection by using the dummy interconnection. As a result, even when the positions of the first and second externally connected interconnections are determined automatically or semi-automatically such as by using an automatic routing program, the pin access route on the first function cell plane and the pin access route in the second function cell plane can be made almost the same more reliably.

Since the first and second function cells having different outlines of the first and second externally connected interconnections can be designed by using the dummy interconnection, the degree of freedom in designing the first and second function cells can be made higher.

In the semiconductor device in the one aspect above, the first function cell may include a first impurity diffusion region, and the second function cell may include a second impurity diffusion region. The impurity concentration in the first impurity diffusion region may be different from the impurity concentration in the second impurity diffusion region.

In this case, the electrical characteristics of the first and second function cells can be made different from each other by changing the impurity concentrations in the first and second impurity diffusion regions without changing the sizes of the first and second impurity diffusion regions and the configurations of electrodes and the like in the first and second function cells. As a result, the first and second function cells can be designed more easily.

Since the electrical characteristics of the first and second function cells are changed, the gate width, for example, of an field effect transistor in the function cell can not be adjusted, when it is to be adjusted, with accuracy higher than the accuracy of the minimum processed dimension in the photolithography process during semiconductor device formation. When the electrical characteristics are to be changed by adjusting the impurity concentration in the impurity diffusion region through controlling the amount of impurity implantation in the impurity diffusion region, the electrical characteristics can be adjusted more accurately than when they are changed by adjusting the gate width.

In the semiconductor device in the one aspect above, the first function cell may include a first element configuration including the first impurity diffusion region, and the second function cell may include a second element configuration including the second impurity diffusion region. The external shape of the first element configuration may be almost the same as the external shape of the second element configuration.

In this case, since the first and second element configurations in the first and second function cells can be made almost the same, the first and second function cells can be designed more easily. As a result, the effort necessary to produce the cell library that includes the first and second function cells can be reduced, and the manufacturing cost of the cell library can be lowered. Accordingly, the cost for developing and manufacturing semiconductor devices can be lowered.

In the semiconductor device in the one aspect above, the first function cell may include a first internal interconnection, and the second function cell may include a second internal interconnection. The material of the first internal interconnection may be different from the material of the second internal interconnection.

In this case, as a means of changing the electrical characteristics of the function cell, the electric resistance value, for example, of the internal interconnection can be adjusted by changing the material of the internal interconnection. As a result, the electrical characteristics of the function cell can be adjusted to a greater extent by changing the material of the internal interconnection as a means of adjusting the electrical characteristics of the first and second function cells.

In a semiconductor circuit designing method in another aspect of the present invention, a first function cell is selected and placed from a cell library that includes first and second function cells having different electrical characteristics from each other. A first pin access route in the first function cell is determined. The external shape of the first function cell is almost the same as the external shape of the second function cell. The first pin access route is almost the same as a second pin access route that is determined for the second function cell when the second function cell is selected and placed.

Accordingly, even when the first function cell is replaced by the second function cell to satisfy a condition of circuit constraints by adjusting signal timing, for example, in the semiconductor circuit, the function cell placement and the interconnection route for the function cell are not changed. Accordingly, the condition of circuit constraints can reliably be satisfied by adjusting the electrical characteristics of the function cell. Thus, the function cell placement and the interconnection route do not have to be corrected. As a result, it is not necessary to carry out again a verification test for determining whether the condition of constraints is satisfied and to repeat the processing from a logic correction step to an interconnection route correction step, differently from conventional methods. Thus, the time necessary to design semiconductor device circuits can be shortened.

In the semiconductor circuit designing method in the another aspect above, the steps of selecting and placing the second function cell, and determining the second pin access route in the second function cell may further be provided.

In the semiconductor circuit designing method in the another aspect above, the first function cell may include a first externally connected interconnection and a dummy interconnection. The dummy interconnection may be formed on the same plane as the first externally connected interconnection. The second function cell may include a second externally connected interconnection. The position of a region occupied by the first externally connected interconnection and the dummy interconnection on the first function cell plane may be almost the same as the position of a region occupied by the second externally connected interconnection on the second function cell plane.

In this case, even when the outline of the first externally connected interconnection in the first function cell is different from the outline of the second externally connected interconnection in the second function cell, the position of the region occupied by the first externally connected interconnection and the dummy interconnection can be made almost the same as the position of the region occupied by the second externally connected interconnection by using the dummy interconnection. As a result, even when the pin access routes to the first and second function cells are determined automatically or semi-automatically such as by using an automatic routing program, the pin access routes on the first and second function cell planes can be made almost the same more reliably.

Since the dummy interconnection is used, the first and second function cells having different outlines of the first and second externally connected interconnections can be designed. Thus, the degree of freedom in designing the first and second function cells can be made higher.

In the semiconductor circuit designing method in the another aspect above, the first function cell may include a first impurity diffusion region, and the second function cell may include a second impurity diffusion region. The impurity concentration in the first impurity diffusion region may be different from the impurity concentration in the second impurity diffusion region.

In this case, the electrical characteristics of the first and second function cells can be made different from each other by changing the impurity concentrations in the first and second impurity diffusion regions without changing the sizes of the first and second impurity diffusion regions and the configurations of electrodes and the like in the first and second function cells. As a result, the first and second function cells can be designed more easily.

Since the electrical characteristics of the first and second function cells are changed, the gate width, for example, of a field effect transistor in the function cell can not be changed, when it is to be changed, with accuracy higher than the accuracy of the minimum processed dimension in the photolithography process during semiconductor device formation. When the electrical characteristics are to be changed by adjusting the impurity concentration in the impurity diffusion region, the electrical characteristics can be changed more accurately than when they are adjusted by adjusting the gate width, for example, through controlling the amount of impurity implantation in the impurity diffusion region.

In the semiconductor circuit designing method in the another aspect above, the first function cell may include a first element configuration including the first impurity diffusion region, and the second function cell may include a second element configuration including the second impurity diffusion region. The external shape of the first element configuration may be almost the same as the external shape of the second element configuration.

In this case, since the first and second element configurations in the first and second function cells can be made almost the same, the first and second function cells can be designed more easily. As a result, the effort necessary to produce a cell library that includes the first and second function cells can be reduced, and the manufacturing cost of the cell library can be lowered. Accordingly, the cost for developing and manufacturing semiconductor devices can be lowered.

In the semiconductor circuit designing method in the another aspect above, the first function cell may include a first internal interconnection, and the second function cell may include a second internal interconnection. The material of the first internal interconnection may be different from the material of the second internal interconnection.

In this case, since the material of the internal interconnection can be changed as a means of changing the electrical characteristics of the function cell, the degree of freedom in designing the function cells of the cell library can be made higher.

A function cell in still another aspect of the present invention used in cell-base type semiconductor circuit designing includes first and second function cells that realize the same logic circuit function and have different electrical characteristics from each other. The first function cell includes a first externally connected interconnection. The second function cell includes a second externally connected interconnection. The external shape of the first function cell is almost the same as the external shape of the second function cell. The position of the first externally connected interconnection in the first function cell plane is almost the same as the position of the second externally connected interconnection on the second function cell plane.

It is assumed here that the first function cell is replaced by the second function cell having different electrical characteristics from those of the first function cell to satisfy a condition of circuit constraints such as of signal timing when the first function cell is used in semiconductor circuit designing. In this case, the first function cell only has to be replaced by the second function cell, and the function cell placement and the interconnection route do not have to be corrected. Accordingly, after logic correction is carried out to satisfy the condition of constraints, it is not necessary to carry out function cell replacement, function cell placement correction, interconnection route correction, and a verification retest to determine whether the condition of constraints is satisfied, differently from conventional methods. As a result, the time necessary to design semiconductor circuits can substantially be shortened as compared with conventional methods.

In the function cell in the still another aspect above, the first function cell may include a dummy interconnection formed on the same plane as the first externally connected interconnection. The position of a region occupied by the first externally connected interconnection and the dummy interconnection on the first function cell plane may be almost the same as the position of a region occupied by the second externally connected interconnection on the second function cell plane.

In this case, even when replacement of the first and second function cells is to be carried out, a pin access route of an interconnection for connecting an input/output pin terminal formed in the function cell to the outside can be made almost the same between the first and second function cells by making the position of the region occupied by the second externally connected interconnection almost the same as the position of the region occupied by the first externally connected interconnection and the dummy interconnection.

Since the dummy interconnection is formed, the pin access routes in the first and second function cells can be made almost the same even when the positions and the shapes of the first and second externally connected interconnections are different. As a result, the degree of freedom in designing the first and second interconnections can be made higher.

In the function cell in the still another aspect above, the first function cell may include a first impurity diffusion region, and the second function cell may include a second impurity diffusion region. The impurity concentration in the first impurity diffusion region may be different from the impurity concentration in the second impurity diffusion region.

In this case, the electrical characteristics of the first and second function cells can easily be adjusted differently by setting the first and second impurity diffusion regions to have different impurity concentrations.

When the shape of a component, such as the electrode width of a field effect transistor, which is a component of the function cell, is controlled in order to adjust the electrical characteristics of the first and second function cells, the accuracy of electrical characteristics adjustment is determined by the minimum processed dimension in the photolithography process for use in function cell formation. When the electrical characteristics such as electric resistance are to be adjusted by impurity concentration, however, the impurity concentration can be controlled by controlling the amount of impurity implantation, and the electrical characteristics of the function cell can be adjusted more accurately regardless of the minimum processed dimension.

In the function cell in the still another aspect above, the first function cell may include a first element configuration including the first impurity diffusion region, and the second function cell may include a second element configuration including the second impurity diffusion region. The external shape of the first element configuration may be almost the same as the external shape of the second element configuration.

In this case, since the first and second function cells have the same element configuration, the first and second function cells can be designed more easily. As a result, the cost for designing function cells can be reduced further.

In the function cell in the still another aspect above, the first function cell may include a first internal interconnection, and the second function cell may include a second internal interconnection. The material of the first internal interconnection may be different from the material of the second internal interconnection.

In this case, a means of changing the materials of the first and second internal interconnections can be used to adjust the electrical characteristics of the first and second function cells. Accordingly, the degree of freedom in designing the first and second function cells can be made higher.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in the following with reference to the drawings.

First Embodiment

Figure 1:
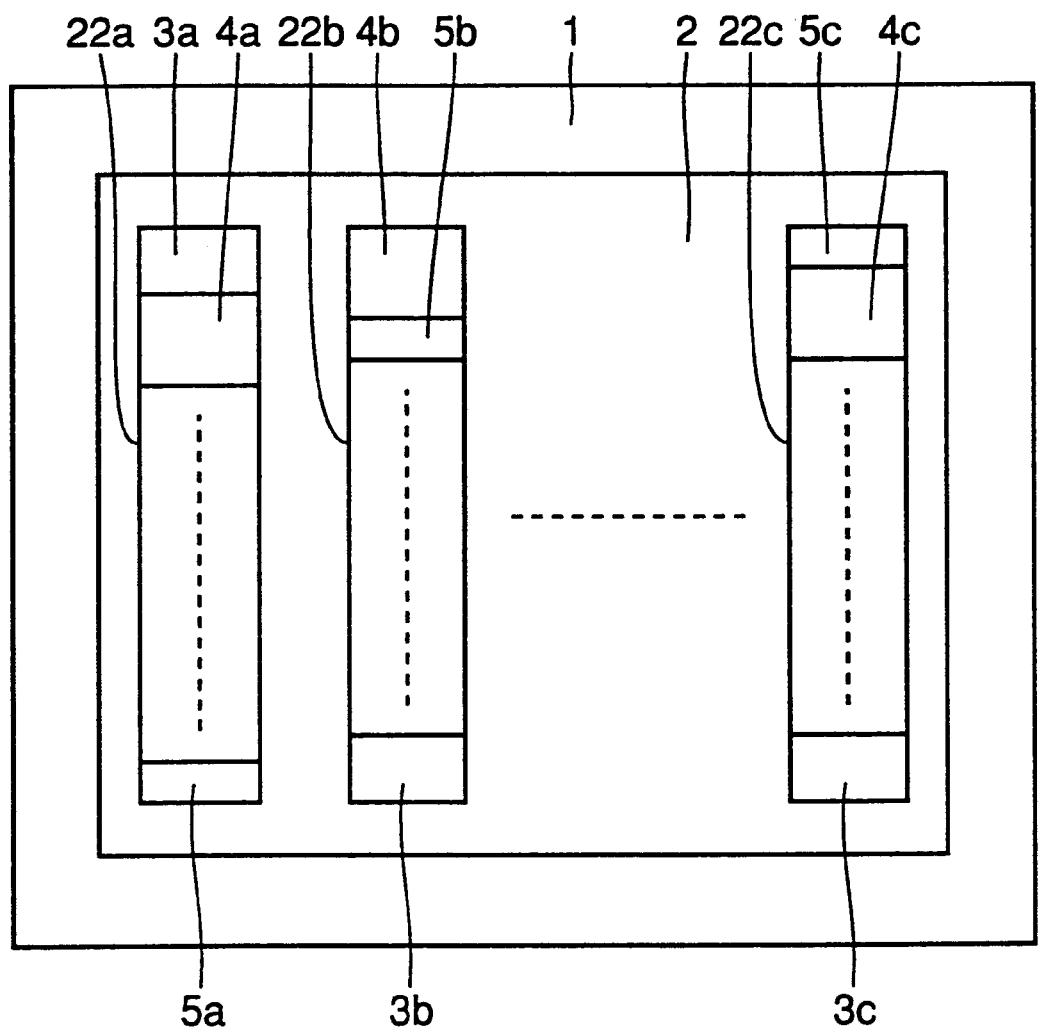
FIG. 1 is a schematic plan view of a semiconductor device according to a first embodiment of the present invention.

Referring to FIG. 1, the semiconductor device includes an input/output circuit region 1, an interconnection region 2, and function cell columns 22a to 22c. Input/output circuit region 1 is formed on the periphery of the semiconductor device. Interconnection region 2 is formed to be surrounded by input/output circuit region 1. Function cell columns 22a to 22c are formed in interconnection region 2. In function cell columns 22a to 22c, function cells 3a to 3c, 4a to 4c, 5a to 5c for realizing various logic circuit functions are formed.

Although function cells 3a to 3c realize the same logic circuit function, their electrical characteristics are different from one another. Function cells 3a to 3c that realize the same logic circuit function in spite of their different electrical characteristics have almost the same external shape.

Although function cells 4a to 4c have different electrical characteristics, they realize the same logic circuit function. The external shapes of function cells 4a to 4c are almost the same. The same is true of function cells 5a to 5c.

Figure 2:
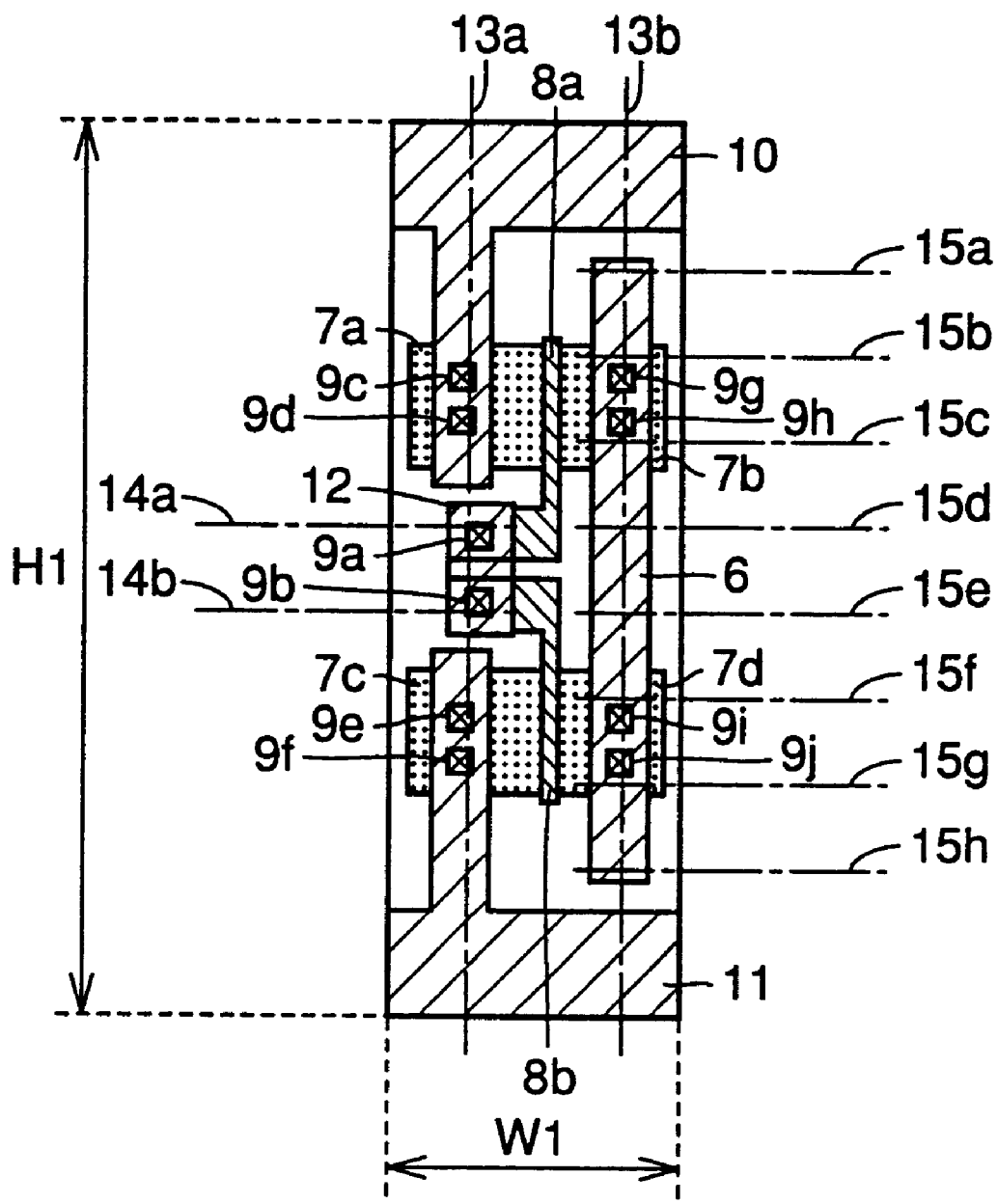
FIGS. 2 and 3 are schematic plan views of function cells 3a and 3b shown in FIG. 1.
Figure 3:
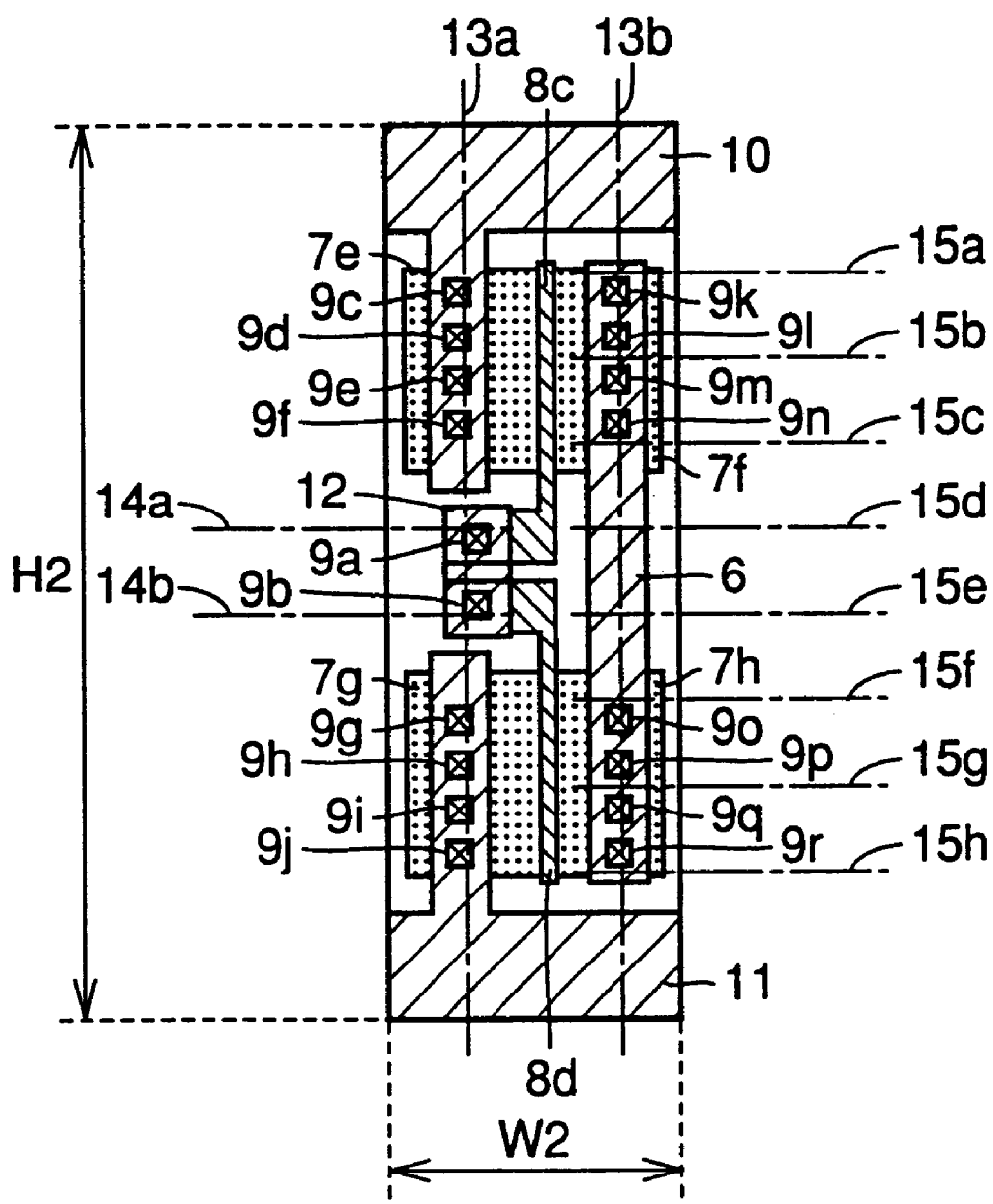

Referring to FIGS. 2 and 3, function cells 3a, 3b will be described.

Referring to FIG. 2, function cell 3a includes impurity diffusion regions 7a to 7d, gate electrodes 8a, 8b, an input pin terminal 12, an output pin terminal 6, an interconnection for a power supply (hereinafter, referred to as a power-supply interconnection) 10, and an interconnection for a ground (hereinafter, referred to as a ground interconnection) 11. In the function cell, p type impurity diffusion regions 7a, 7b are formed on a main surface of a semiconductor substrate so that they are spaced apart. Between impurity diffusion regions 7a, 7b, gate electrode 8a is formed on the main surface of the semiconductor device with a gate insulation film therebetween. Impurity diffusion regions 7a, 7b serving as source/drain regions, the gate insulation film, and gate electrode 8a constitute a p type field effect transistor. Further, n type impurity diffusion regions 7c, 7c are formed spaced apart from the field effect transistor. Between impurity diffusion regions 7c, 7d, gate electrode 8b is formed on the main surface of the semiconductor substrate with the gate insulation film therebetween. Impurity diffusion regions 7c, 7d serving as source/drain regions, the gate insulation film, and gate electrode 8b constitute another n type field effect transistor.

An interlayer insulation film (not shown) is formed on impurity diffusion regions 7a to 7d and gate electrodes 8a, 8b. Input pin terminal 12 is formed on the interlayer insulation film. Input pin terminal 12 is electrically connected to gate electrodes 8a, 8b via contact holes 9a, 9b. Output pin terminal 6 is formed on the interlayer insulation film. Output pin terminal 6 is electrically connected to impurity diffusion regions 7b, 7d via contact holes 9g to 9j. Power-supply interconnection 10 and ground interconnection 11 are formed on the interlayer insulation film. Power-supply interconnection 10 is electrically connected to impurity diffusion region 7a via contact holes 9c, 9d. Ground interconnection 11 is electrically connected to impurity diffusion region 7c via contact holes 9e, 9f.

Figure 13:
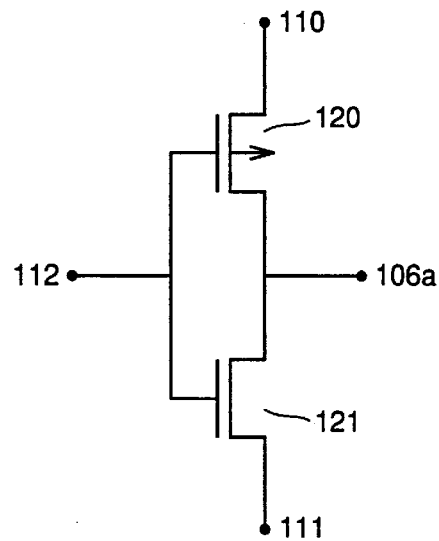
FIG. 13 is an equivalent circuit diagram showing the logic circuit function realized in the function cells in FIGS. 11 and 12.

As described above, the inverter function as shown in FIG. 13 is realized in function cell 3a shown in FIG. 2. For input pin terminal 12, a longitudinal pin access route is denoted by 13a and lateral pin access routes are denoted by 14a, 14b. For output pin terminal 6, a longitudinal pin access route is denoted by 13b and lateral pin access routes are denoted by 15a to 15h. Function cell 3a has a longitudinal length of H1 and a lateral length of W1.

Referring to FIG. 3, function cell 3b basically has a similar configuration to that of the function cell shown in FIG. 2. In function cell 3b shown in FIG. 3, however, the shapes of impurity diffusion regions 7e to 7h and gate electrodes 8c, 8d are different from the shapes of impurity diffusion regions 7a to 7d and gate electrodes 8a, 8b in function cell 3a shown in FIG. 2. Accordingly, function cell 3b shown in FIG. 3 has the gate width of a field effect transistor larger than the gate width of a field effect transistor in the function cell shown in FIG. 2. Accordingly, function cell 3b shown in FIG. 3 has drivability higher than that of function cell 3a shown in FIG. 2, and function cells 3a, 3b shown in FIGS. 2 and 3 have different electrical characteristics from each other.

In the present invention, function cells 3a, 3b, which have different electrical characteristics from each other but realize almost the same logic circuit function, have almost the same external shape as shown in FIGS. 2 and 3. Specifically, longitudinal length H1 and lateral length W1 of function cell 3a shown in FIG. 2 are almost the same as longitudinal length H2 and lateral length W2 of function cell 3b shown in FIG. 3.

Function cells 3a, 3b shown in FIGS. 2 and 3 have almost the same position and shape of interconnections other than gate electrodes 8a to 8d, namely, power-supply interconnection 10 and ground interconnection 11, input pin terminal 12 and output pin terminal 6. As a result, function cells 3a, 3b shown in FIGS. 2 and 3 have pin access routes 13a, 13b, 14a, 14b, 15a to 15h for input pin terminal 12 and output pin terminal 6, which are almost the same.

Since such function cells are used in the semiconductor device according to the present invention, the term necessary for circuit designing of the semiconductor device shown in FIG. 1 can substantially be shortened as described below in detail.

Figure 4:
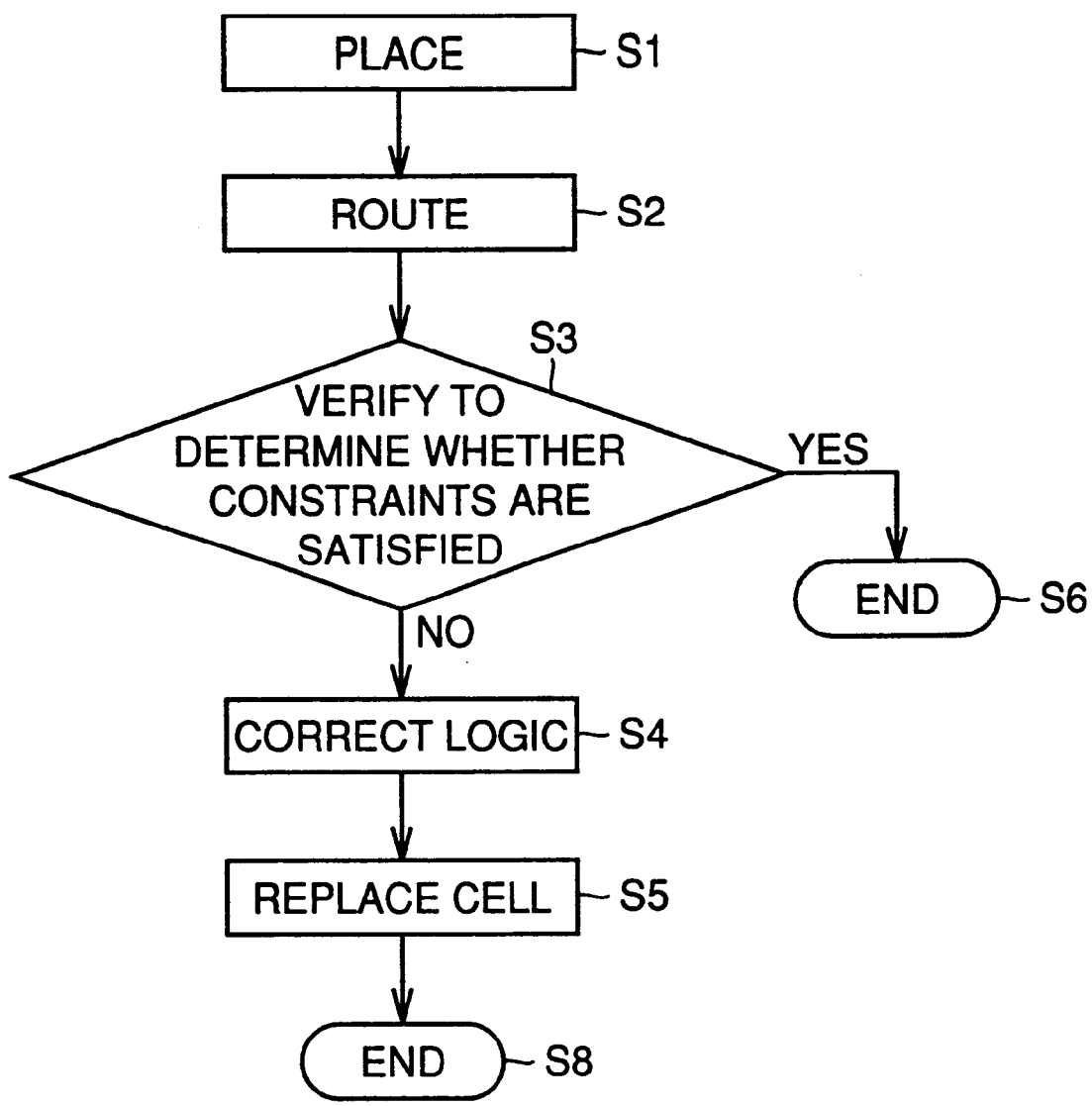
FIG. 4 is a flow chart of the circuit designing process of the semiconductor device shown in FIG. 1.

Referring to FIG. 4, in the circuit designing process of the semiconductor device according to the present invention, the steps of selecting and placing function cells 3a to 3c, 4a to 4c, 5a to 5c (see FIG. 1) (S1) and routing interconnections for connecting the function cells and connecting the function cells and the input/output circuit and the like (S2) are first carried out similarly to conventional processes.

Then, a verification test (S3) of circuit electrical characteristics is carried out as to whether signal timing, for example, satisfies a condition of constraints required for the semiconductor device when the circuit formed of the function cells and the interconnections is supplied with a signal. When the condition of constraints required for the circuit is satisfied, circuit designing is ended (S6).

When the condition of constraints is not satisfied, a logic correction step (S4) for eliminating the dissatisfaction of the condition of restraints is carried out. Here, it is assumed as an example that the dissatisfactory condition is caused, due to the lack of drivability of a field effect transistor in the inverter, at a portion in which the function cell shown in FIG. 2 is used as the function cell for realizing the inverter function. In this case, logic correction is carried out so that a function cell having higher drivability is used in stead of the function cell shown in FIG. 2.

After such a logic correction step (S4), a function cell replacement step (S5) is carried out according to the logic correction. Specifically, the function cell shown in FIG. 3 is placed instead of the function cell shown in FIG. 2 at a place where the function cell shown in FIG. 2 has been placed.

Figure 14:
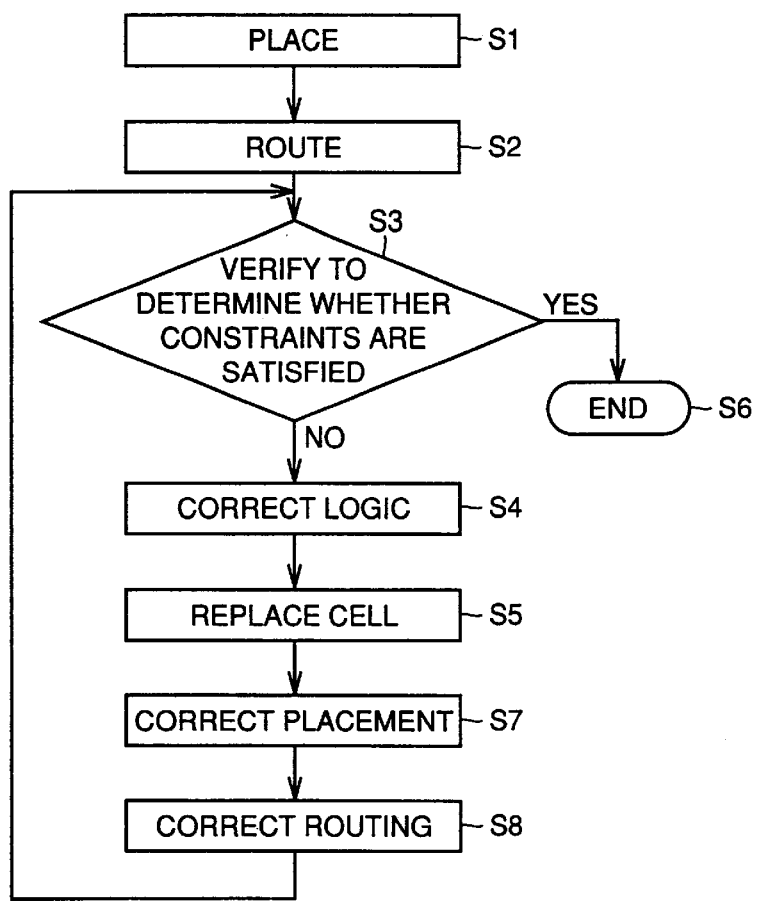
FIG. 14 is a flow chart of the conventional semiconductor circuit designing process.

In this case, since the function cells shown in FIGS. 2 and 3 have almost the same external shapes and pin access routes 13a, 13b, 14a, 14b, 15a to 15h, the steps of correcting the function cell placement (S7) (see FIG. 14) and correcting the interconnection routes do not have to be carried out, differently from conventional processes, even when replacement of the function cells is carried out. Accordingly, it is not necessary to repeat the steps of estimating interconnection routes after logic correction, correcting the function cell placement and the interconnection routes based on the estimate, and verifying as to whether the condition of constraints is satisfied in the circuit after logic correction, differently from conventional processes.

Accordingly, in the semiconductor device circuit designing process according to the present invention, the circuit designing process can be completed by carrying out the logic correction step (S4) and thereafter the function cell replacement step (S5) in accordance with the logic correction. As a result, the term necessary for circuit designing can substantially be shortened as compared with conventional processes. Thus, the term and cost for developing semiconductor devices can substantially be reduced.

Figure 5:
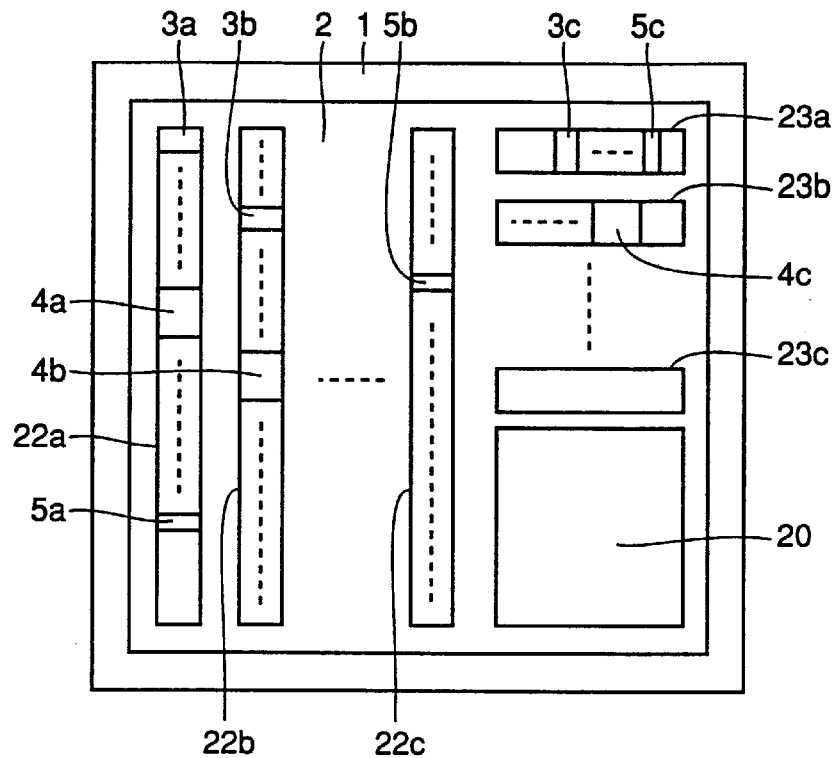
FIGS. 5 and 6 are schematic plan views showing first and second variations of the semiconductor device, shown in FIG. 1, according to the first embodiment of the present invention.

Referring to FIG. 5, the semiconductor device basically has a similar configuration to that of the semiconductor device shown in FIG. 1. In the semiconductor device shown in FIG. 5, however, function cell columns 22a to 22c formed to extend longitudinally and function cell rows 23a to 23c formed to extend laterally coexist. Further, the semiconductor device may include a mega cell (micro cell) 20 in which routing is carried out by a method other than that using an automatic placement routing tool. The interconnection routes in mega cell 20 may be determined manually.

In such a semiconductor device as well, similar effects to those of the semiconductor device shown in FIG. 1 can be attained by using function cells 3a to 3c, 4a to 4c, 5a to 5c according to the present invention.

Figure 6:
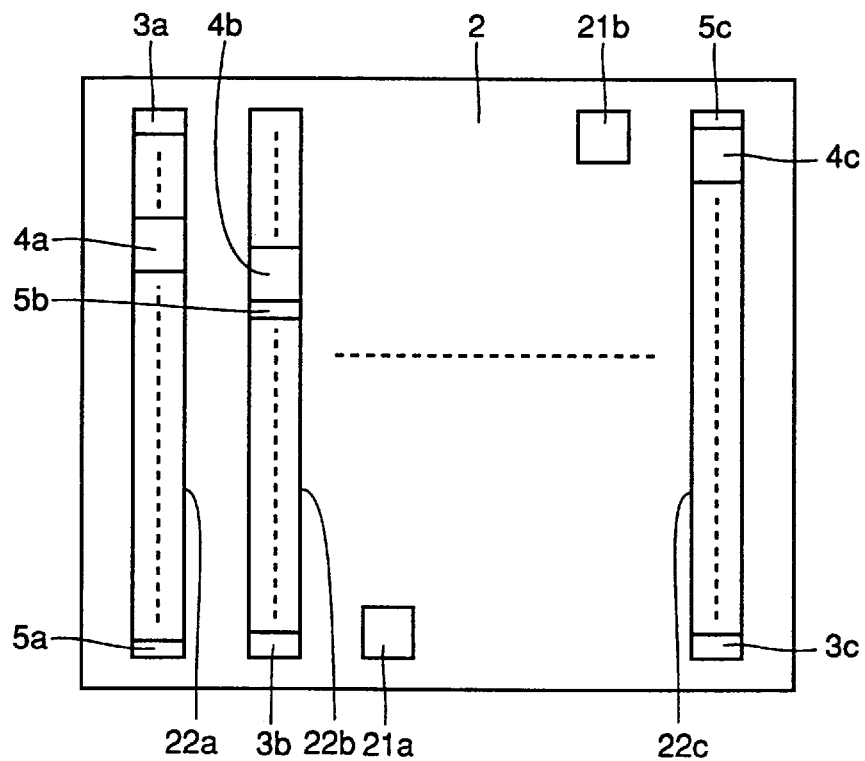

Referring to FIG. 6, the semiconductor device basically has a similar configuration to that of the semiconductor device shown in FIG. 1. In the semiconductor device shown in FIG. 6, however, input/output circuit regions 21a, 21b are formed inside interconnection region 2. In such a semiconductor device as well, similar effects to those of the semiconductor device shown in FIG. 1 can be attained by using function cells 3a to 3c, 4a to 4c, 5a to 5c according to the present invention.

Second Embodiment

Figure 7:
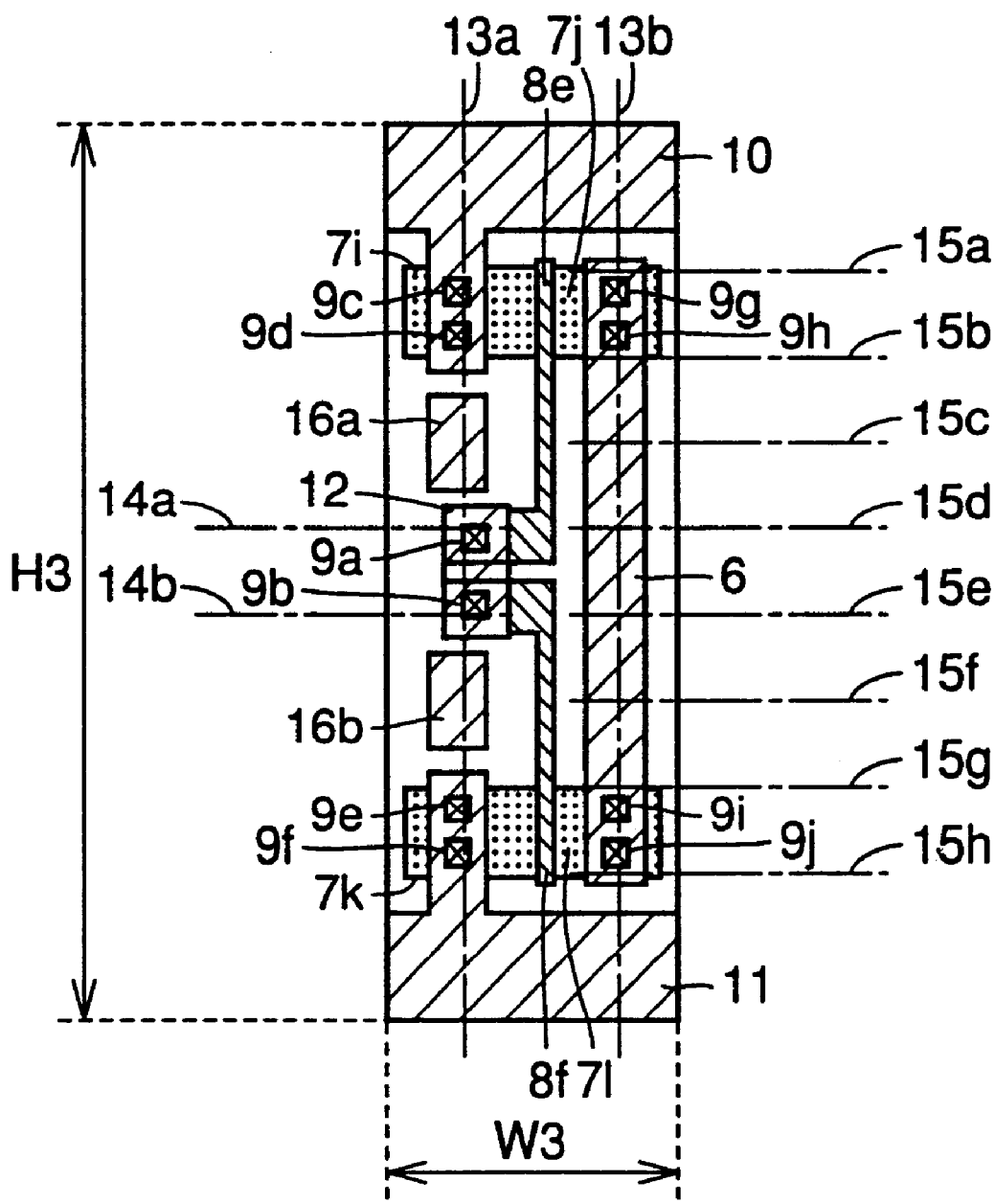
FIGS. 7 and 8 are schematic plan views showing semiconductor device function cells according to a second embodiment of the present invention.
Figure 8:
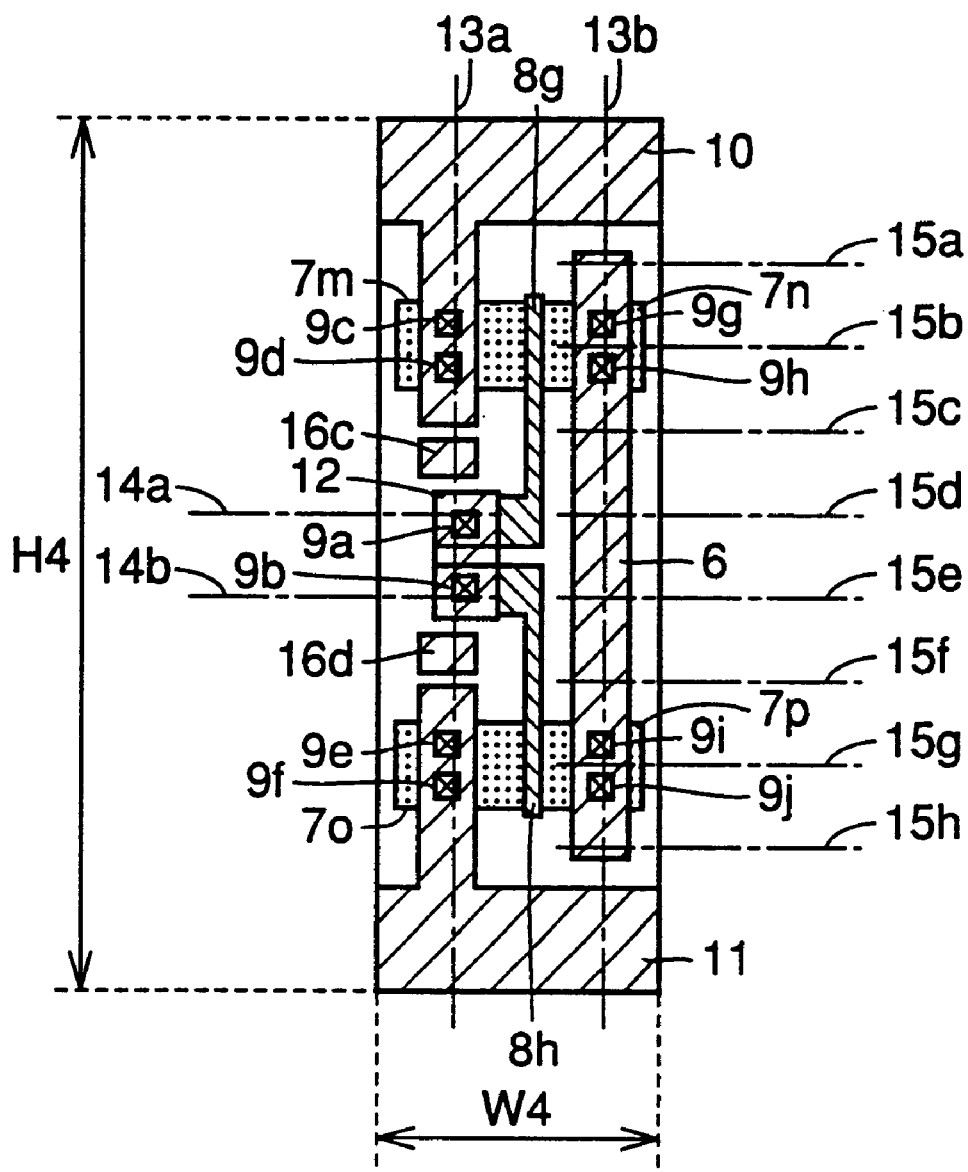

Referring to FIGS. 7 and 8, function cells will be described.

Referring to FIG. 7, the function cell basically has a similar configuration to that of the function cell, shown in FIG. 3, according to the first embodiment of the present invention. Although the function cell shown in FIG. 7 realizes the inverter circuit function similarly to the function cell shown in FIG. 3, the size of impurity diffusion regions 7i to 7l serving as source/drain regions of field effect transistors is different from that of the function cell shown in FIG. 3. Accordingly, the function cells shown in FIGS. 3 and 7 realize the same logic circuit function but have different electrical characteristics from each other.

In the function cell shown in FIG. 7, the position in which impurity diffusion regions 7i to 7l are formed is different from that of the function cell shown in FIG. 3. Thus, the shapes of power-supply interconnection 10 and ground interconnection 11 are different from the shapes of power-supply interconnection 10 and ground interconnection 11 in the function cell shown in FIG. 3. However, since dummy interconnections 16a, 16b for preventing creation of an unnecessary pin access route to input pin terminal 12, in the step of determining the pin access routes during circuit designing, are formed, pin access routes 14a, 14b to input pin terminal 12 are almost the same as pin access routes 14a, 14b to input pin terminal 12 in the function cell shown in FIG. 3.

In the function cell in FIG. 7, the shapes and formed positions of output pin terminal 6, gate electrodes 8e, 8f and input pin terminal 12 are similar to those of the function cell shown in FIG. 3. The external shape of the function cell shown in FIG. 7 is almost the same as the external shape of the function cell shown in FIG. 3. Longitudinal length H3 and lateral length W3 of the function cell shown in FIG. 7 are almost the same as longitudinal length H2 and lateral length W2 of the function cell shown in FIG. 3.

As described above, in the function cells that realize the same logic circuit function and have different electrical characteristics from each other, the pin access routes can be made almost the same by using dummy interconnections 16a and 16b for adjusting the pin access routes. As a result, similar effects to those of the semiconductor device and the semiconductor device function cell according to the first embodiment of the present invention can be attained.

When the function cell in the second embodiment of the present invention is applied to the semiconductor circuit designing method described in the first embodiment, similar effects to those of the semiconductor circuit designing method in the first embodiment can be attained.

Referring to FIG. 8, the function cell basically has a similar configuration to that of the function cell shown in FIG. 7. In the function cell shown in FIG. 8, however, the position in which impurity diffusion regions 7m to 7p are formed is different from that of the function cell shown in FIG. 7. The shape of gate electrodes 8g, 8h is also different from that of the function cell shown in FIG. 7. Since the position of a region in which impurity diffusion regions 7m to 7p are formed is different from that of the function cell shown in FIG. 7, the shapes of power-supply interconnection 10 and ground interconnection 11 and the shapes of dummy interconnections 16c, 16d in the function cell shown in FIG. 8 are different from those of the function cell shown in FIG. 7.

Even when the shapes of power-supply interconnection 10 and ground interconnection 11 are changed, as the shapes of elements in the function cell change, as shown in FIGS. 7 and 8, pin access routes 13a, 13b, 14a, 14b, 15a to 15h in the function cells shown in FIGS. 7 and 8 can be made almost the same as pin access routes 13a, 13b, 14a, 14b, 15a to 15h in the function cell shown in FIG. 3 by adjusting the placement and shape of dummy interconnections 16a to 16d. As a result, similar effects to those of the function cell of the semiconductor device according to the first embodiment of the present invention can be attained and, at the same time, the degree of freedom in designing the shapes of the elements and the routes of power-supply interconnection 10 and ground interconnection 11, for example, in the function cells can be made higher.

Third Embodiment

Figure 9:
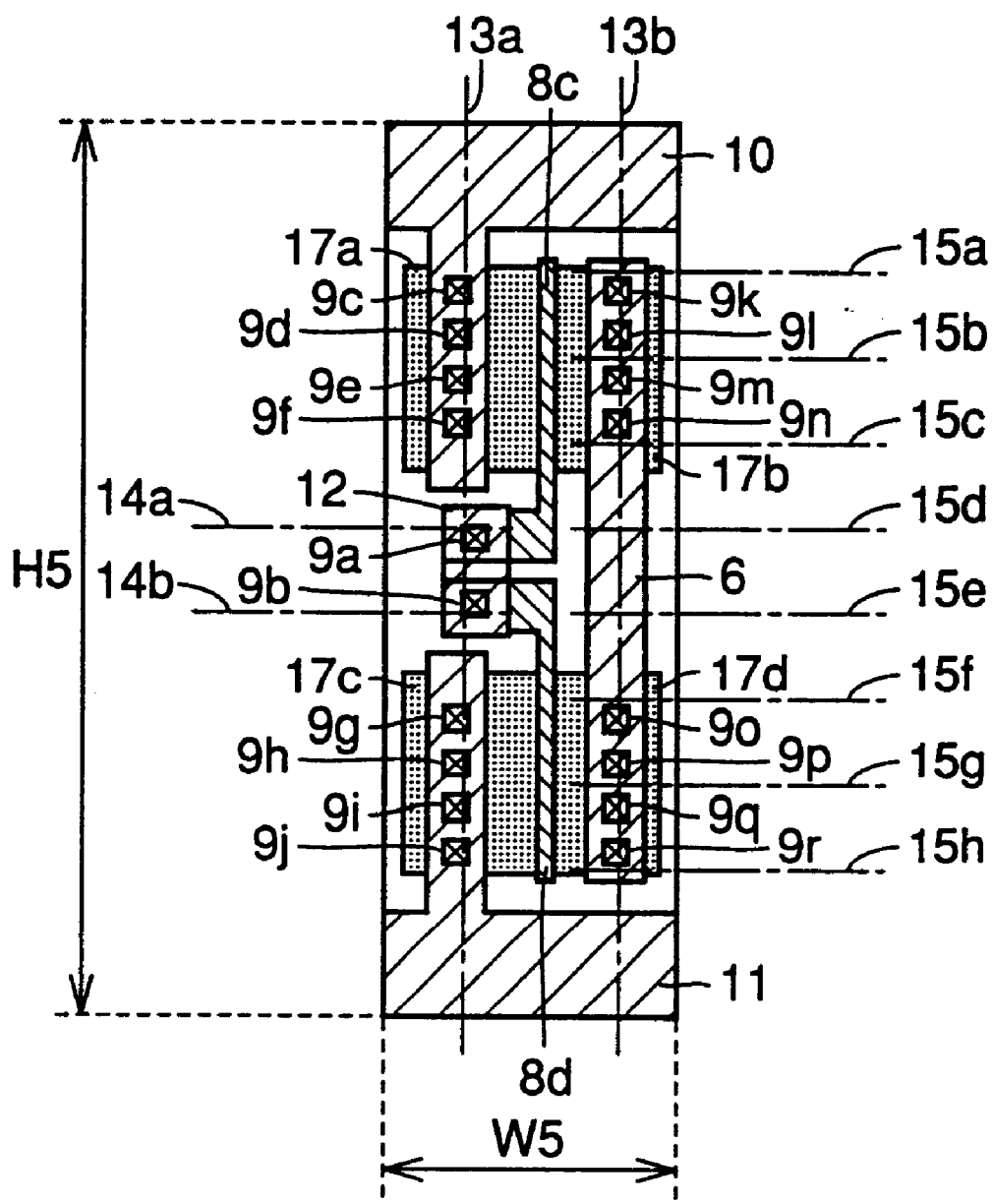
FIG. 9 is a schematic plan view showing a semiconductor device function cell according to a third embodiment of the present invention.

Referring to FIG. 9, a function cell will be described.

Referring to FIG. 9, the function cell basically has a similar configuration to that of the function cell according to the first embodiment of the present invention. In the function cell shown in FIG. 9, however, the impurity concentration in impurity diffusion regions 17a to 17d is lower than the impurity concentration in impurity diffusion regions 7e to 7h in the function cell shown in FIG. 3. The function cell shown in FIG. 3 and the function cell shown in FIG. 9 have almost the same configuration except the impurity concentration in impurity diffusion regions 17a to 17d. By changing the impurity concentration in impurity diffusion regions 17a to 17d as described above, the function cells that realize the same logic circuit function and have different electrical characteristics, such as drivability, from each other can easily be realized in the function cells shown in FIGS. 3 and 9.

Since the shapes and placement of input pin terminal 12, output pin terminal 6, power-supply terminal 10 and ground terminal 11 are almost the same in the function cells shown in FIGS. 3 and 9, pin access routes 13a, 13b, 14a, 14b, 15a to 15h can be made almost the same. As a result, similar effects to those of the semiconductor device and semiconductor device function cell according to the first embodiment of the present invention can be attained.

When the function cell in the third embodiment of the present invention is applied to the semiconductor circuit designing method described in the first embodiment, similar effects to those of the semiconductor circuit designing method in the first embodiment can be attained.

Since the impurity concentration in impurity diffusion regions 17a to 17d is adjusted to adjust the electrical characteristics of the function cell, it is not necessary to redesign the function cell configuration as in the case in which the shape of gate electrodes 8c, 8d themselves is changed to change the electrical characteristics of the function cell, and the function cells that realize the same logic circuit function and have different electrical characteristics can easily be formed.

When the shape of a gate electrode, for example, is changed to change the electrical characteristics of the function cell, the adjustment accuracy is limited by the minimum processed dimension in the photolithography for use in function cell formation. If the impurity concentration in impurity diffusion regions 17a to 17d is adjusted to adjust the electrical characteristics of the function cell, however, such a limitation as described above is not imposed by the minimum processed dimension, and the electrical characteristics of the function cell can be adjusted more accurately.

Fourth Embodiment

Figure 10:
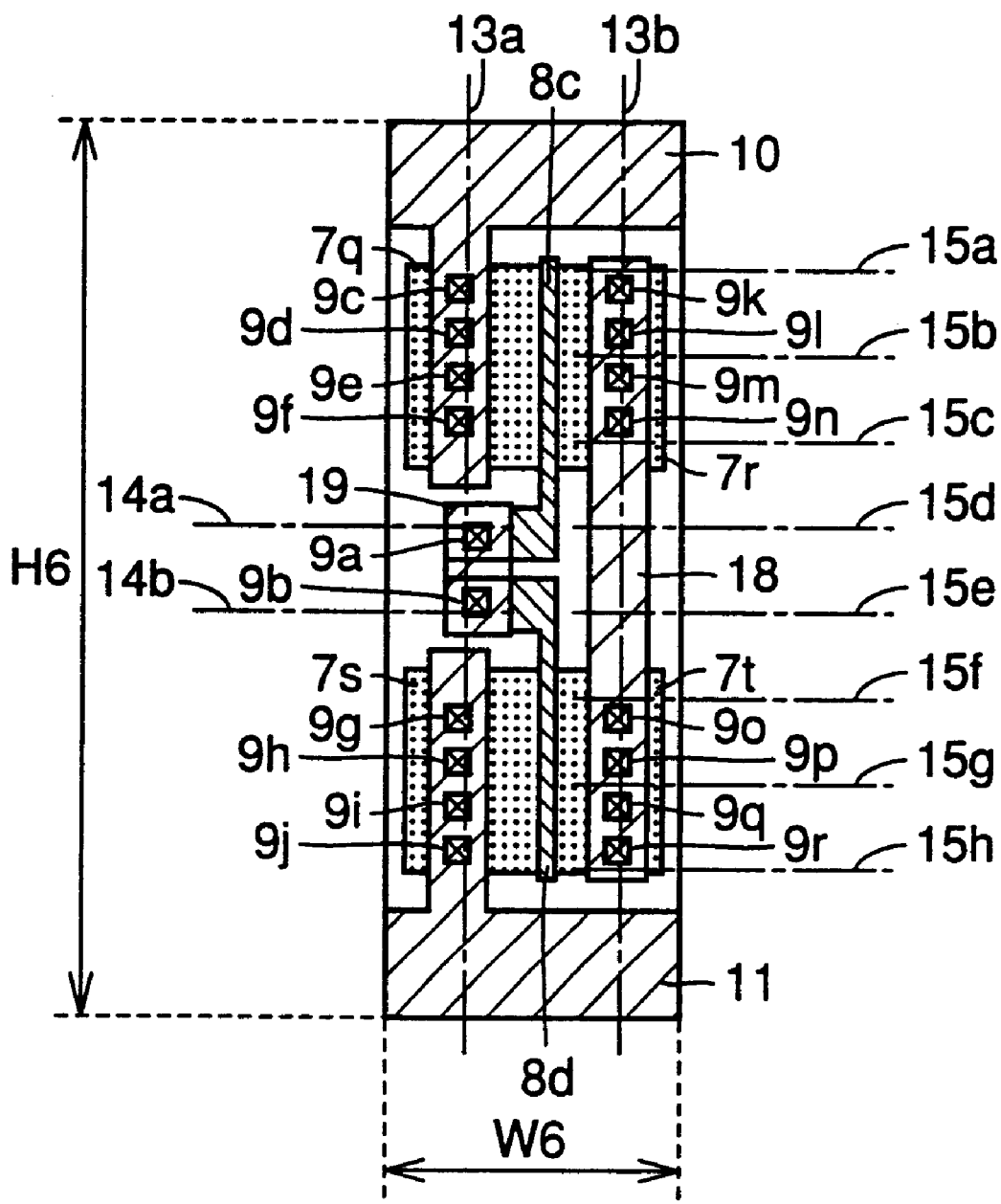
FIG. 10 is a schematic plan view showing a semiconductor device function cell according to a fourth embodiment of the present invention.
Figure 11:
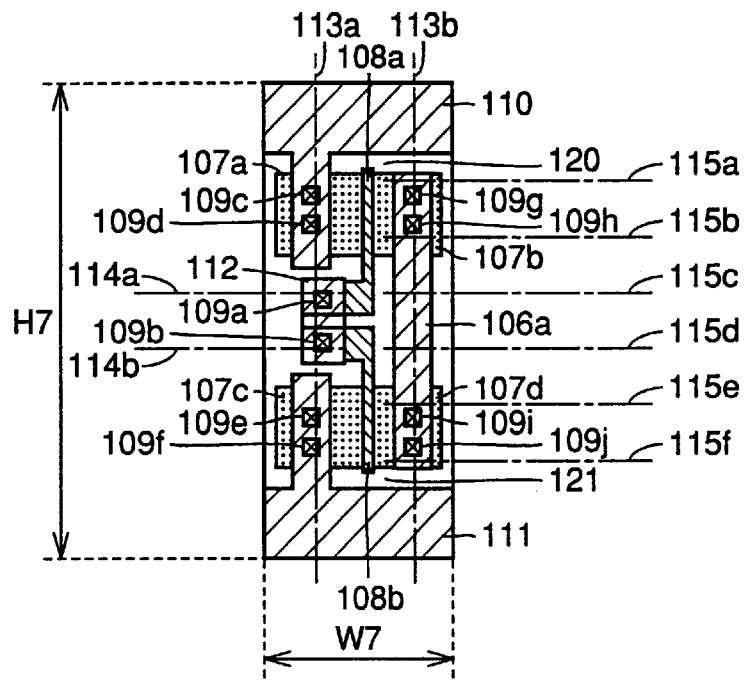
FIG. 11 is a schematic plan view of a conventional semiconductor function cell.
Figure 12:
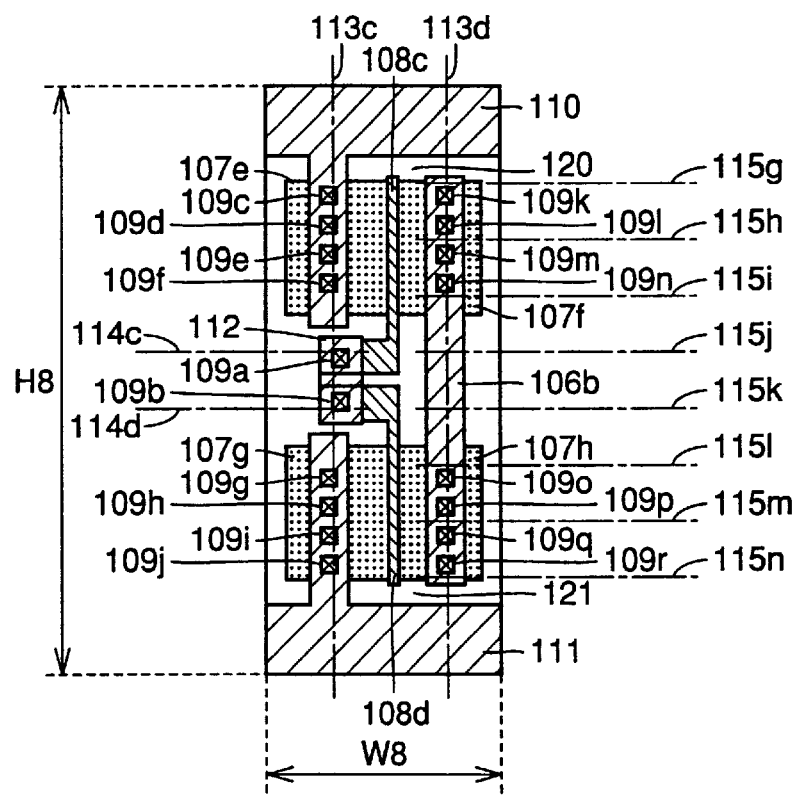
FIG. 12 is a schematic plan view showing another example of the conventional semiconductor function cell.

Referring to FIG. 10, a function cell will be described.

Referring to FIG. 10, the function cell basically has the same configuration to that of the function cell, shown in FIG. 3, according to the first embodiment of the present invention. Longitudinal length H6 and lateral length W6 of the function cell are almost the same as longitudinal length H2 and lateral length W2 of the function cell shown in FIG. 3. Pin access routes 13a, 13b, 14a, 14b, 15a to 15h in the function cell shown in FIG. 10 are almost the same as pin access routes 13a, 13b, 14a, 14b, 15a to 15h in the function cell shown in FIG. 3. In the function cell shown in FIG. 10, however, the material of an input pin terminal 19 and an output pin terminal 18 is different from that of the function cell shown in FIG. 3.

Specifically, input pin terminal 12 and output pin terminal 6 are formed of aluminum in the function cell shown in FIG. 3 while input pin terminal 19 and output pin terminal 18 are formed of an alloy of aluminum and copper in the function cell shown in FIG. 10.

Since a material that is different from that of input pin terminal 12 and output pin terminal 6 in the function cell shown in FIG. 3 is used for input pin terminal 19 and output pin terminal 18 as described above, the characteristics of an electric resistance value, for example, of input pin terminal 19 and output pin terminal 18 can be made different from the characteristics in the function cell shown in FIG. 3. Accordingly, the electrical characteristics of the function cell can be changed while the shapes of input pin terminal 19 and output pin terminal 18 and the like are the same as those of the function cell shown in FIG. 3. As a result, the function cells that realize the same logic circuit function and have different electrical characteristics from each other as shown in FIGS. 3 and 10 can easily be obtained.

When such a function cell is applied to the semiconductor device, similar effects to those of the semiconductor device and the function cell in the first embodiment of the present invention can be attained and, at the same time, the degree of freedom in function cell designing can be made higher since the material of input pin terminal 19 and the like is changed to adjust the electrical characteristics of the function cell.

When the function cell in the fourth embodiment of the present invention is applied to the semiconductor circuit designing method described in the first embodiment, similar effects to those of the semiconductor circuit designing method in the first embodiment can be attained.

Further, data representing the configurations of the function cells in the first and fourth embodiments may be recorded on a computer-readable recording medium such as a magnetic disc and a CD-ROM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising first and second function cells that realize the same logic circuit function and have different electrical characteristics from each other, said first function cell including a first externally connected interconnection, said second function cell including a second externally connected interconnection, an external size and shape of said first function cell being almost the same as an external size and shape of said second function cell, and a position of said first externally connected interconnection on a plane of said first function cell being almost the same as a position of said second externally connected interconnection on a plane of said second cell.

2. The semiconductor device according to claim 1, wherein said first function cell includes a dummy interconnection formed almost on the same plane as said externally connected interconnection, and a position of a region occupied by said first externally connected interconnection and said dummy interconnection on said first function cell plane is almost the same as a position of a region occupied by said second externally connected interconnection on said second function cell plane.

3. The semiconductor device according to claim 2, wherein said first function cell includes a first impurity diffusion region, said second function cell includes a second impurity diffusion region, and an impurity concentration in said first impurity diffusion region is different from an impurity concentration in said second impurity diffusion region.

4. The semiconductor device according to claim 3, wherein said first function cell includes a first element configuration including said first impurity diffusion region, said second function cell includes a second element configuration including said second impurity diffusion region, and an external shape of said first element configuration is almost the same as an external shape of said second element configuration.

5. The semiconductor device according to claim 1, wherein said first function cell includes a first internal interconnection, said second function cell includes a second internal interconnection, and a material of said first internal interconnection is different from a material of said second internal interconnection.

6. The semiconductor device according to claim 1, wherein said first function cell includes a first impurity diffusion region, said second function cell includes a second impurity diffusion region, and an impurity concentration in said first impurity diffusion region is different from an impurity concentration in said second impurity diffusion region.

7. The semiconductor device according to claim 6, wherein said first function cell includes a first element configuration including said first impurity diffusion region, said second function cell includes a second element configuration including said second impurity diffusion region, and an external shape of said first element configuration is almost the same as an external shape of said second element configuration.

8. A function cell used in cell-base type semiconductor circuit designing, comprising first and second function cells that realize the same logic circuit function and have different electrical characteristics from each other, said first function cell including a first externally connected interconnection, said second function cell including a second externally connected interconnection, an external size and shape of said first function cell being almost the same as an external size and shape of said second function cell, and a position of said first externally connected interconnection on a plane of said first function cell being almost the same as a position of said second externally connected interconnection on a plane of said second cell.

9. The function cell according to claim 8, wherein said first function cell includes a dummy interconnection formed almost on the same plane as said first externally connected interconnection, and a position of a region occupied by said first externally connected interconnection and said dummy interconnection on said first function cell plane is almost the same as a position of a region occupied by said second externally connected interconnection on said second function cell plane.

10. The function cell according to claim 9, wherein said first function cell includes a first impurity diffusion region, said second function cell includes a second impurity diffusion region, and an impurity concentration in said first impurity diffusion region is different from an impurity concentration in said second impurity diffusion region.

11. The function cell according to claim 10, wherein said first function cell includes a first element configuration including said first impurity diffusion region, said second function cell includes a second element configuration including said second impurity diffusion region, and an external shape of said first element configuration is almost the same as an external shape of said second element configuration.

12. The function cell according to claim 8, wherein said first function cell includes a first internal interconnection, said second function cell includes a second internal interconnection, and a material of said first internal interconnection is different from a material of said second internal interconnection.

13. The function cell according to claim 8, wherein said first function cell includes a first impurity diffusion region, said second function cell includes a second impurity diffusion region, and an impurity concentration in said first impurity diffusion region is different from an impurity concentration in said second impurity diffusion region.

14. The function cell according to claim 13, wherein said first function cell includes a first element configuration including said first impurity diffusion region, said second function cell includes a second element configuration including said second impurity diffusion region, and an external shape of said first element configuration is almost the same as an external shape of said second element configuration.

\* \* \* \* \*